(12) United States Patent
Huang

(10) Patent No.: US 7,868,311 B2
(45) Date of Patent: Jan. 11, 2011

(54) PHASE CHANGE MEMORY ELEMENT AND METHOD FOR FORMING THE SAME

(75) Inventor: Chen-Ming Huang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 310 days.

(21) Appl. No.: 12/203,891

(22) Filed: Sep. 3, 2008

(65) Prior Publication Data

US 2009/0250691 A1 Oct. 8, 2009

(30) Foreign Application Priority Data

Apr. 3, 2008 (TW) .............................. 97112146 A

(51) Int. Cl.
*H01L 29/02* (2006.01)
*H01L 21/00* (2006.01)
(52) U.S. Cl. ............ 257/2; 257/E31.029; 257/E45.001; 257/E21.068; 438/95; 438/238
(58) Field of Classification Search ...................... 257/2, 257/42, E45.001, E31.029, E29.088, E21.068; 438/95, 102, 238
See application file for complete search history.

(56) References Cited

U.S. PATENT DOCUMENTS

| 7,075,131 | B2 * | 7/2006 | Chen .......................... 257/246 |
| 7,119,353 | B2 | 10/2006 | Lankhorst et al. |
| 7,135,727 | B2 * | 11/2006 | Lee et al. ..................... 257/296 |
| 7,655,941 | B2 * | 2/2010 | Lin et al. ....................... 257/4 |
| 2004/0248339 | A1 * | 12/2004 | Lung ........................... 438/102 |
| 2008/0237565 | A1 * | 10/2008 | Chang ........................... 257/4 |

* cited by examiner

*Primary Examiner*—Lex Malsawma

(57) ABSTRACT

A phase change memory and method for fabricating the same are provided. The phase change memory element includes: a substrate; rectangle-shaped dielectric patterns formed on the substrate and parallel with each other; electric conductive patterns partially covering a first sidewall and the top surface of the dielectric pattern and the substrate to expose the first sidewall and a second sidewall of the dielectric pattern, wherein the electric conductive patterns covering the same dielectric pattern are apart from each other; a phase change spacer formed on the substrate and directly in contact with the exposed first and second sidewalls of the dielectric patterns, wherein the two adjacent electric conductive patterns covering the same dielectric pattern are electrically connected by the phase change spacer; and a dielectric layer formed on the substrate.

19 Claims, 9 Drawing Sheets

PHASE CHANGE MEMORY ELEMENT AND METHOD FOR FORMING THE SAME

CROSS REFERENCE TO RELATED APPLICATIONS

This application is based upon and claims the benefit of priority from the prior Taiwan Patent Application No. 97112146, filed on Apr. 3, 2008, the entire contents of which are incorporated herein by reference.

BACKGROUND OF THE INVENTION

1. Field of the Invention

The invention relates to a memory element and method for forming the same, and more particularly to a phase change memory element memory element and method for forming the same.

2. Description of the Related Art

Electronic devices use different types of memories, such as DRAM, SRAM and flash memory or a combination based on application requirements, operating speed, memory size and cost considerations of the devices. Current new developments in the memory technology field include FeRAM, MRAM and phase change memory. Among these alternative memories, phase change memory is most likely to be mass-produced in the near future.

Currently, a phase change memory cell is developed with several goals in mind: low programming current, higher reliability (including electromigration risk), and smaller cell size. To reduce the programming current, the most straightforward way is to shrink the heating area. A benefit of this strategy is simultaneous reduction of cell size. Yet, as CMOS elements become smaller, forming small contacts to the phase change layer pattern has generally become increasingly difficult. This difficulty arises because the reduction of design rules limit photolithography processes for defining contact images on photoresist layers. Furthermore, limitations to the photolithography process may decrease the flexibility of the phase change memory cell fabrication processes.

U.S. Pat. No. 7,119,353 discloses a phase change memory element 10, referring to FIG. 1, including a substrate 14, a CMOS 12 formed on the substrate 14, a dielectric layer 16, a metal plug 18, and a phase change memory cell 20. Particularly, the phase change memory cell 20 includes a phase change material layer 22, and a pair of electrodes 24 and 26. The CMOS 12 electrically contacts to the electrode 24 of the phase change memory cell 20 via the metal plug 18. Accordingly, the dimension of active area (phase change area) can be determined by the thickness of the phase change material layer 22. As shown in FIG. 1, the contact surface between the phase change material layer 22 and the metal plug 18, however, is limited by the diameter of the metal plug 18, thereby making it unable to increase the heating efficiency and reducing the programming current of the phase change memory cells.

Therefore, it is necessary to develop a phase change memory which mitigates the previously described problems.

BRIEF SUMMARY OF THE INVENTION

An exemplary embodiment of a phase change memory element includes: a substrate; a plurality of rectangle-shaped dielectric patterns formed on the substrate and parallel with each other; a plurality of electric conductive patterns partially covering a first sidewall and the top surface of the dielectric pattern and the substrate to expose a part of the first sidewall and a second sidewall of the dielectric pattern, wherein the electric conductive patterns covering the same dielectric pattern are apart from each other; a phase change spacer formed on the substrate and directly in contact with the exposed first and second sidewalls of the dielectric patterns, wherein the two adjacent electric conductive patterns covering the same dielectric pattern are electrically connected by the phase change spacer; and a dielectric layer blanketly formed on the substrate, wherein a contact hole passes through the dielectric layer exposing the top surface of the patterned electric conductive layer.

Another exemplary embodiment a method for forming the aforementioned phase change memory element includes: providing a substrate; forming a plurality of parallel rectangle-shaped dielectric patterns on the substrate; conformally forming an electric conductive layer on the substrate, completely covering the first and second sidewalls and the top surface of the rectangle-shaped dielectric pattern; patterning the electric conductive layer to form a plurality of electric conductive patterns, wherein the electric conductive patterns partially covers the first sidewall and the top surface of the dielectric pattern and the substrate, exposing a part of the first sidewall and the whole second sidewall, wherein the electric conductive patterns covering the same dielectric pattern are apart from each other; conformally forming a phase change layer on the substrate to cover the exposed first and second sidewalls and the top surface of the dielectric patterns; anisotropically etching the phase change layer to form a phase change spacer on the substrate, wherein the phase change spacer directly contacts the exposed first sidewall of the dielectric patterns, and wherein the two adjacent electric conductive patterns covering the same dielectric pattern are electrically connected by the phase change spacer; blanketly forming a dielectric layer on the substrate; and etching the dielectric layer to form a contact hole passing through the dielectric layer to expose the top surface of the electric conductive patterns.

The phase change memory element of the invention includes reducing a phase change area (active area) to less than the resolution limit of a photolithography process, thereby improving the programming current and promoting the performance of the phase change memory element.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 2a-8a are top-views of a method for fabricating a phase change memory element according to an embodiment of the invention.

FIGS. 2b-8b are respective cross sections along line A-A' of FIGS. 2a~8a, showing the method for fabricating a phase change memory element according to an embodiment of the invention.

FIGS. 4c~8c are respective cross sections along line B-B' of FIGS. 4a~8a, showing the method for fabricating a phase change memory element according to an embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
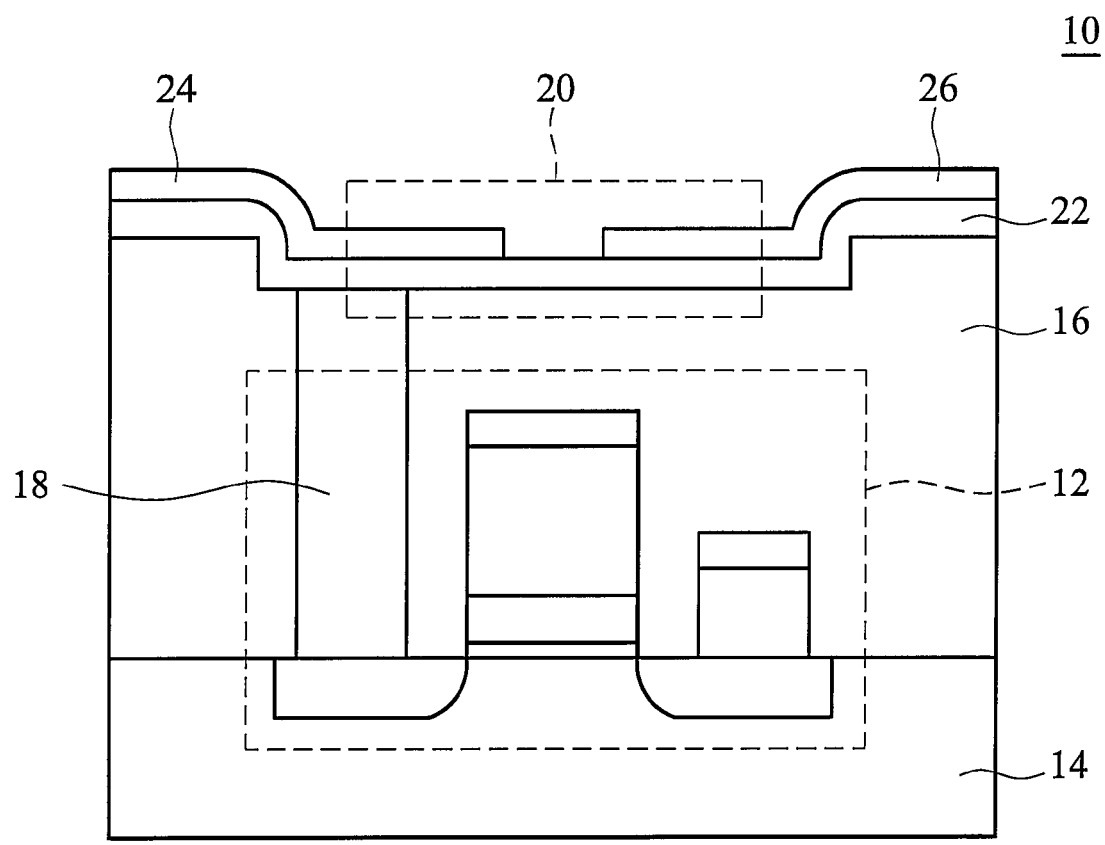
FIG. 1 is a cross section of a conventional device including a phase-change memory element.
Figure 2A:
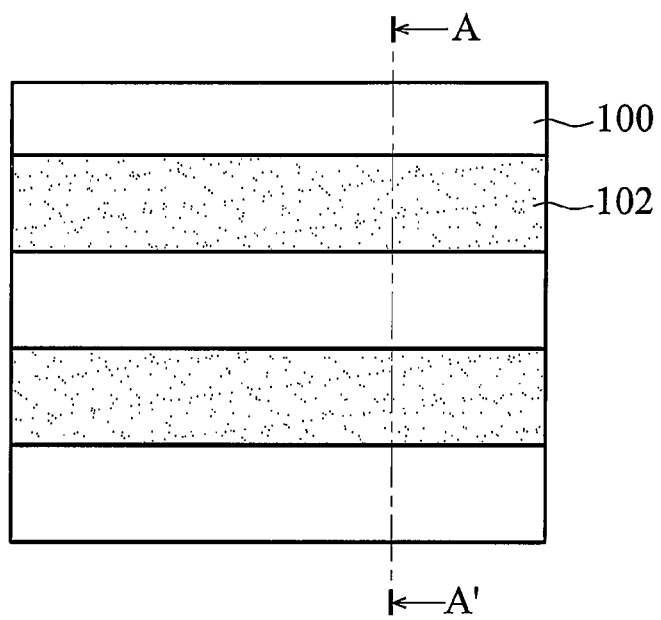
Figure 2B:
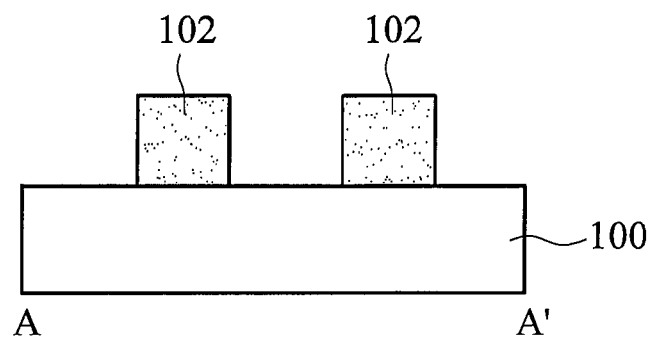

First, referring to FIG. 2a, a substrate 100 with a plurality of rectangle-shaped dielectric patterns 102 formed thereon is provided, exposing parts of surface of the substrate. Particularly, the substrate 100 can be a substrate employed in a semiconductor process, such as silicon substrate. The substrate 100 can be a substrate including a complementary metal oxide semiconductor (CMOS) circuit, isolation structure, diode, or capacitor. The accompanying drawings show the substrate 100 in a plain rectangle in order to simplify the illustration. Suitable material for the dielectric patterns can be silicon-containing material, such as silicon oxide or silicon nitride. FIG. 2b is a cross section along line A-A' of FIG. 2a. As shown in FIG. 2a and 2b, the plurality of rectangle-shaped dielectric patterns 102 are apart from each other by a specific distance and parallel with each other.

Figure 3A:
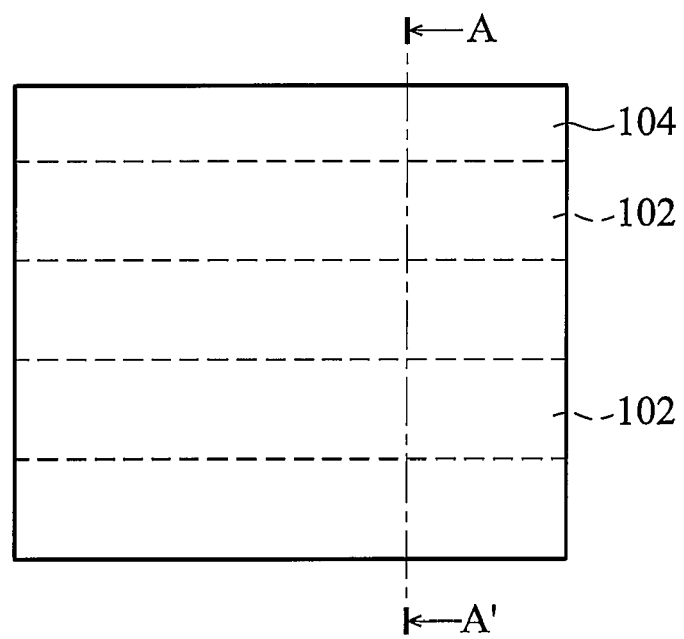
Figure 3B:
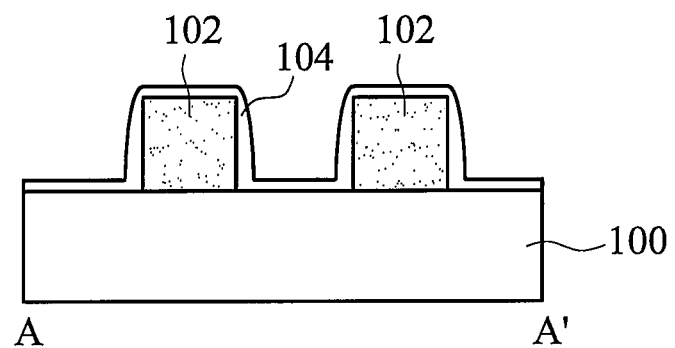

Next, referring to FIG. 3a, an electric conductive layer 104 is conformally formed on the substrate 100. Referring to FIG. 3b, a cross section along line A-A' of FIG. 3a, the electric conductive layer 104 completely covers the sidewalls and the top surface of the dielectric patterns 102. Particularly, the electric conductive layer 104 has a thickness of between 100~2000 Å. Suitable material of the electric conductive layer 104 includes thermal-resistant or Oxidation-resistant metal or alloy, such as Pt, Au, Ag, Pd, Ru, RuO, Ir, IrO, TiN, TiAlN, TaN, or combinations thereof.

Figure 4A:
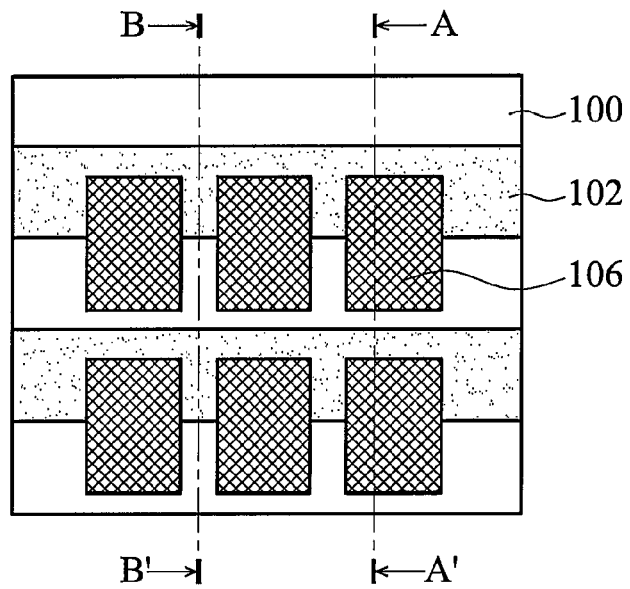
Figure 4B:
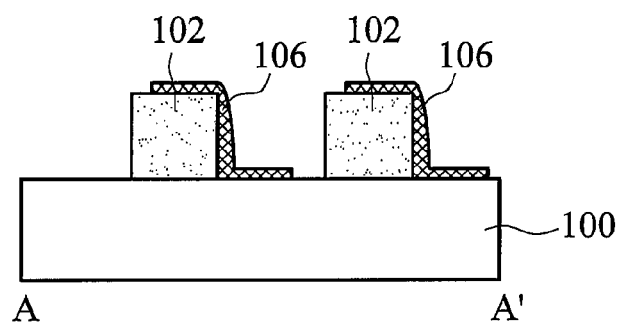
Figure 4C:
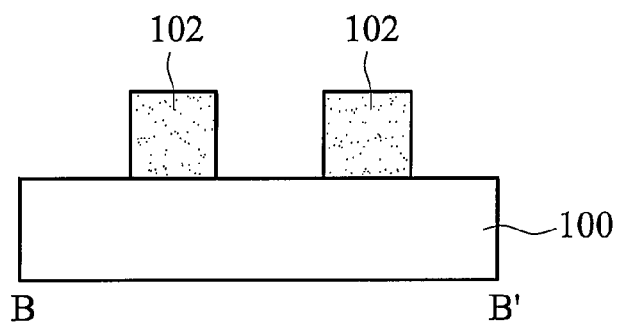

Next, referring to FIG. 4a, the electric conductive layer 104 is patterned to form a plurality of electric conductive patterns 106. The electric conductive patterns 106 can be rectangle-shaped, and the extended direction of the rectangle-shaped dielectric patterns 102 is perpendicular to that of the rectangle-shaped electric conductive patterns 106. The method for patterning the electric conductive layer 104 can include a photolithography process. Referring to FIG. 4b, a cross section along line A-A' of FIG. 4a, the electric conductive patterns 106 partially cover a first sidewall and a top surface of the dielectric layer 102 and the substrate 100, exposing a part of the first sidewall and the top surface and whole second sidewall of the dielectric layer 102. Further, referring to FIG. 4c, a cross section along line B-B' of FIG. 4a, the electric conductive patterns 106 covering the same dielectric pattern are apart from each other by a specific distance and do not contact with each other. After patterning, the second sidewall (opposite to the first sidewall on the same dielectric pattern 102) of the dielectric pattern 102 is completely uncovered and the first sidewall is periodically covered by the electric conductive patterns 106 apart from each other.

Figure 5A:
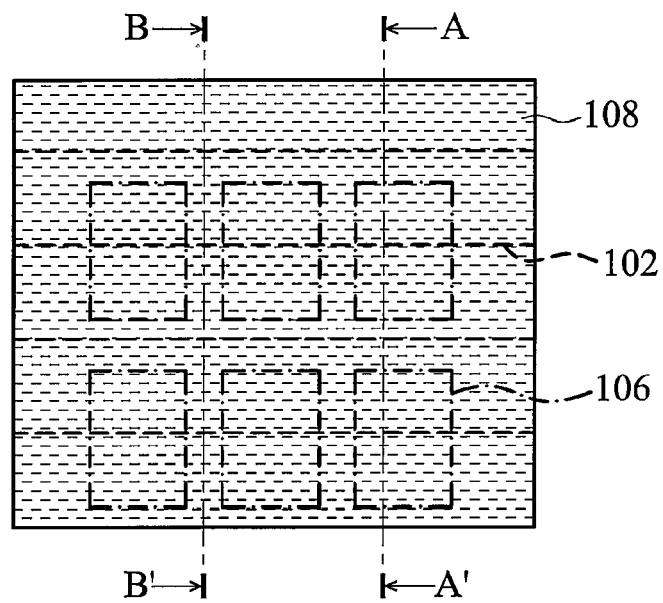
Figure 5B:
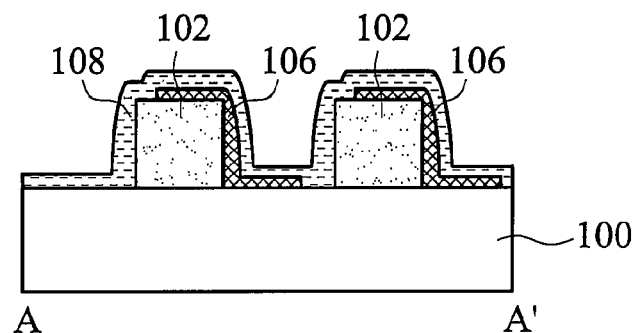
Figure 5C:
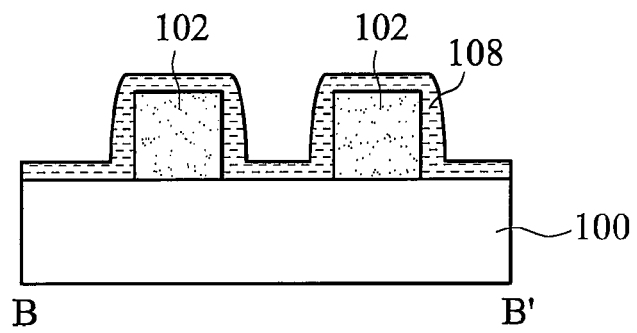

Next, referring to FIG. 5a, a phase change layer 108 is conformally formed on the substrate 100. Referring to FIG. 5b and 5c, respective cross sections along line A-A' and line B-B' of FIG. 5a, the phase change layer 108 completely covers the exposed first sidewall and the top surface (uncovered by the electric conductive patterns 106) and the whole second sidewall of the dielectric patterns 102. Particularly, the phase change layer 108 has a thickness of between 100~2000 Å. The phase change layer 108 can include chalcogenide, such as In, Ge, Sb, Te or combinations thereof, for example GeSbTe or InGeSbTe.

Figure 6A:
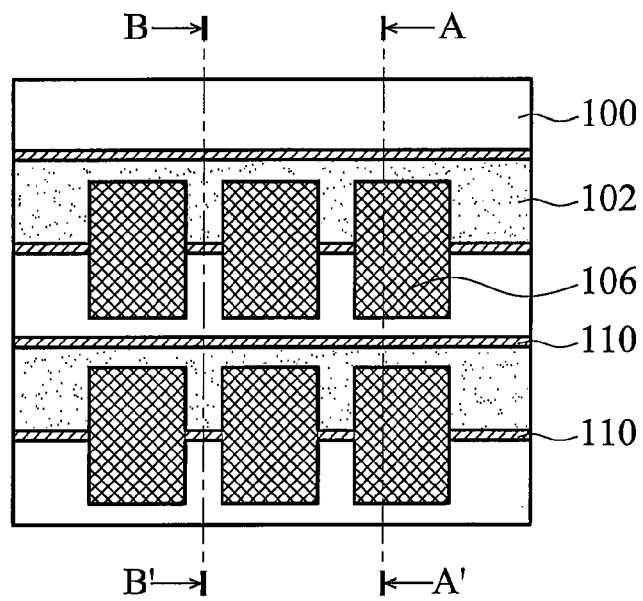
Figure 6B:
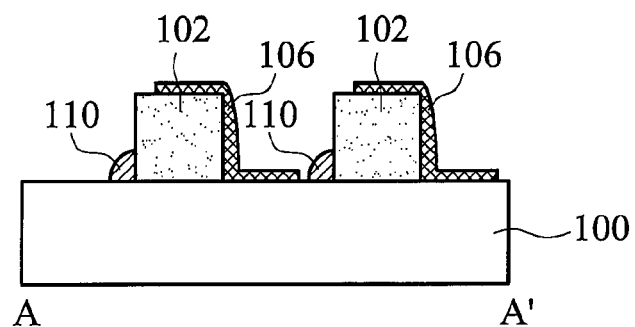
Figure 6C:
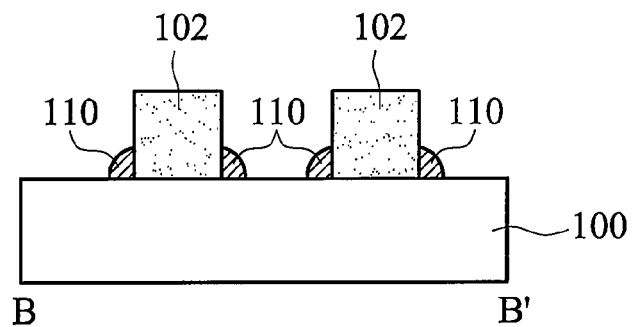

Next, referring to FIG. 6a, the phase change layer 108 is subjected to an anisotropic etching process, leaving a phase change spacer 110 with a fan-shaped profile. Referring to FIG. 6b and 6c, respective cross sections along line A-A' and line B-B' of FIG. 6a, the phase change spacer 110 is formed on the substrate 100 directly in contact with the first and second sidewalls (uncovered by the electric conductive patterns 106) of the dielectric pattern 102. Further, it should be noted that two adjacent electric conductive patterns 106 covering the same dielectric pattern 102 are electrically connected via the phase change spacer 110.

Moreover, during the anisotropic etching step, the phase change layer is trimmed to form the phase change spacer to have a profile dimension that is less than the resolution limit of a photolithography process.

After anisotropic etching, the bottom of the second sidewall of the dielectric patterns is covered by a continuous phase change spacer, and the first sidewall of the dielectric patterns is covered alternately by the electric conductive patterns and the phase change spacer. Herein, the anisotropic etching process includes a dry etching process.

Figure 7A:
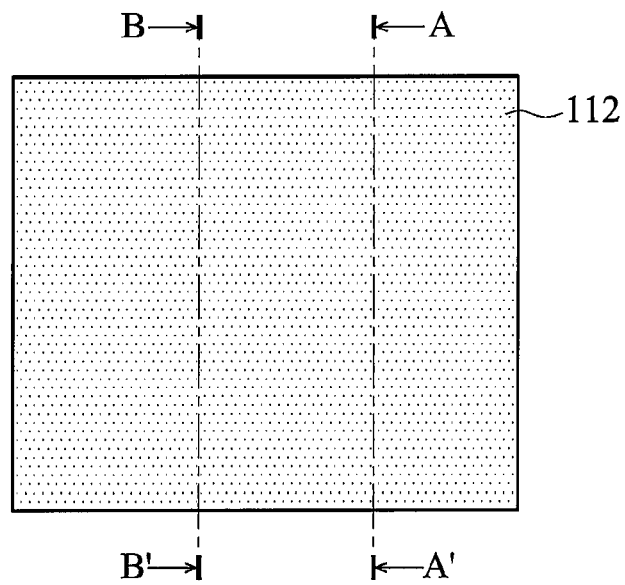
Figure 7B:
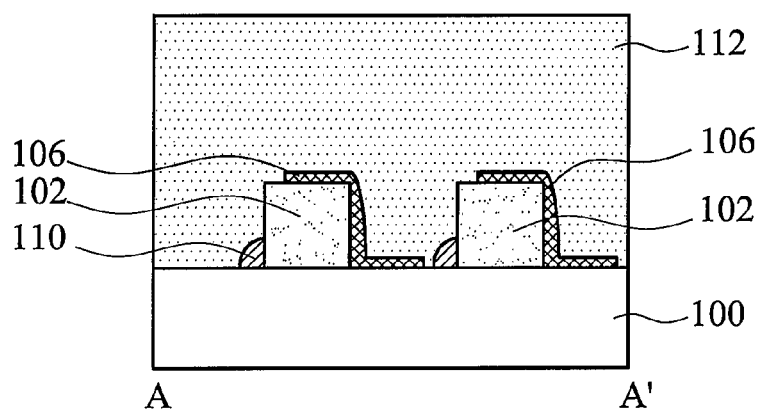
Figure 7C:
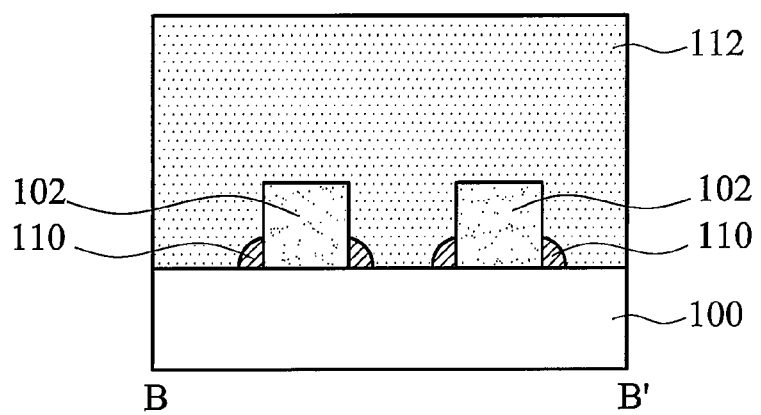

Next, referring to FIG. 7a, a dielectric layer 112 is blanketly formed on the substrate 100 to completely cover the aforementioned structure. FIG. 7b and 7c are respective cross sections along line A-A' and line B-B' of FIG. 7a. The dielectric layer 112 can be a silicon-containing layer, such as silicon nitride or silicon oxide.

Figure 8A:
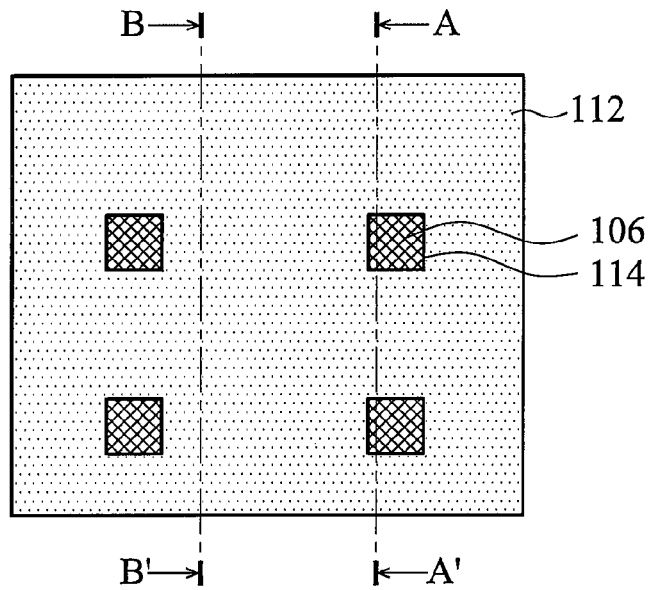
Figure 8B:
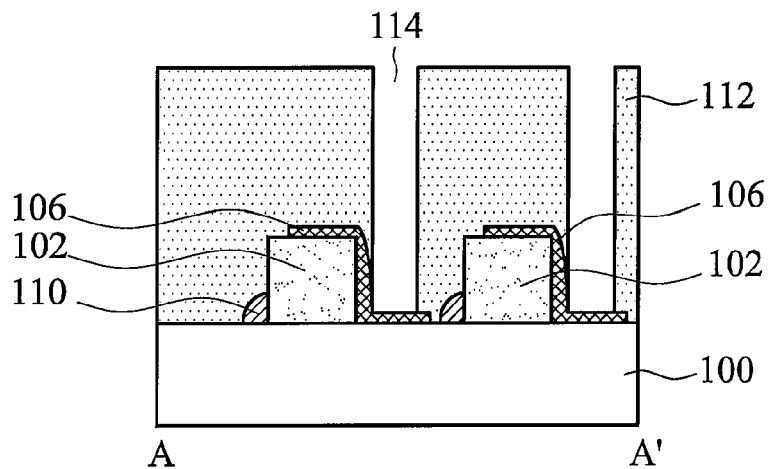
Figure 8C:
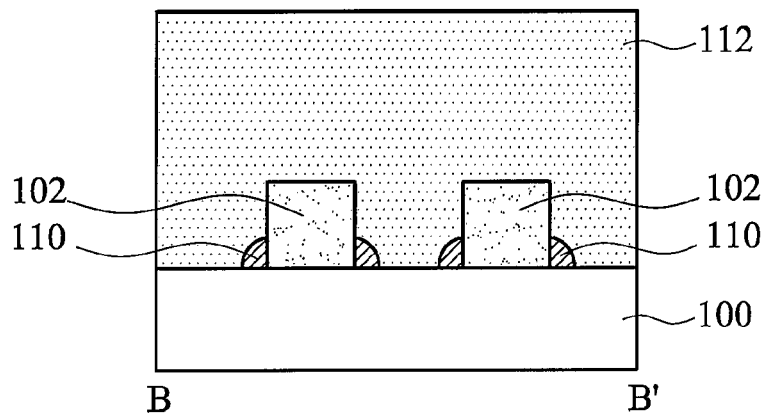

Finally, referring to FIG. 8a, the dielectric layer 112 is etched to form a contact hole 114 exposing the top surface of one electric conductive pattern 106. FIG. 8b and 8c are respective cross sections along line A-A' and line B-B' of FIG. 8a.

Figure 9:
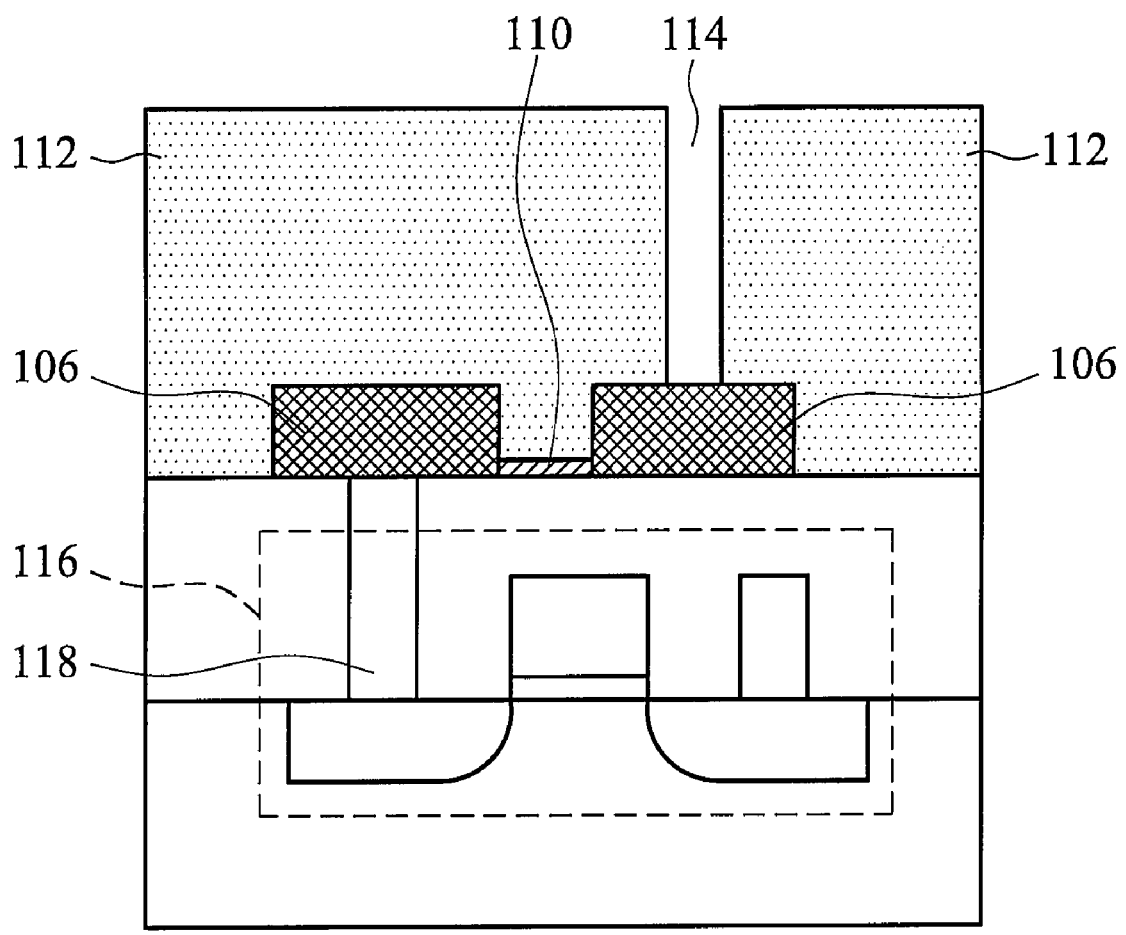
FIG. 9 is a cross section of a device including the phase-change memory element according to an embodiment of the invention.

According to an embodiment of the invention, referring to FIG. 9, a device including the aforementioned phase change memory element is disclosed. The device includes a substrate having a CMOS 116 formed thereon, wherein the CMOS (complementary metal-oxide-semiconductor) 116 is electrically contacted to the electric conductive pattern 106 of the aforementioned phase change memory element via a metal plug 118 with the contact hole 114.

Accordingly, one advantage of the invention is to trim the phase change layer via an anisotropic etching process to form a phase change spacer with a fan-shaped profile, which has a profile dimension that is less than the resolution limit of a photolithography process, resulting in increased heating efficiency. Further, since the phase change spacer is defined by an in-situ anisotropic etching process, there in no requirement for an additional photolithography process for defining the pattern of the phase change spacer, resulting in reduced process complexity and process time, and increasing the production yield of phase change memory elements.

While the invention has been described by way of example and in terms of embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory element, comprising;
   a substrate;
   a plurality of rectangle-shaped dielectric patterns formed on the substrate and parallel with each other;
   a plurality of electric conductive patterns partially covering a first sidewall and the top surface of the rectangle-shaped dielectric pattern and the substrate to expose a part of the first sidewall and a second sidewall of the rectangle-shaped dielectric pattern, wherein the electric conductive patterns covering the same rectangle-shaped dielectric pattern are apart from each other;

a phase change spacer formed on the substrate and directly in contact with the exposed first and second sidewalls of the rectangle-shaped dielectric patterns, wherein the two adjacent electric conductive patterns covering the same rectangle-shaped dielectric pattern are electrically connected by the phase change spacer; and a dielectric layer formed on the substrate, wherein a contact hole passes through the dielectric layer exposing the top surface of the patterned electric conductive layer.

2. The phase change memory element as claimed in claim 1, wherein the rectangle-shaped dielectric pattern comprises a silicon-containing layer.

3. The phase change memory element as claimed in claim 1, wherein the rectangle-shaped dielectric patterns are apart from each other by a specific distance.

4. The phase change memory element as claimed in claim 1, wherein the electric conductive pattern comprises Pt, Au, Ag, Pd, Ru, RuO, Ir, IrO, TiN, TiAlN, TaN, or combinations thereof.

5. The phase change memory element as claimed in claim 1, wherein the electric conductive patterns are rectangle-shaped, and wherein the extended direction of the rectangle-shaped dielectric patterns is perpendicular to that of the rectangle-shaped electric conductive patterns.

6. The phase change memory element as claimed in claim 1, wherein the phase change spacer comprises chalcogenide.

7. The phase change memory element as claimed in claim 1, wherein the profile dimension of the phase change spacer is less than the resolution limit of photolithography process.

8. The phase change memory element as claimed in claim 1, wherein the first sidewall of the rectangle-shaped dielectric pattern is alternately covered by the electric conductive patterns and the phase change spacer.

9. The phase change memory element as claimed in claim 1, wherein the electric conductive pattern is electrically contacted to a metal-oxide-semiconductor.

10. A method for forming a phase change memory element, comprising:

providing a substrate;

forming a plurality of parallel rectangle-shaped dielectric patterns on the substrate;

conformally forming an electric conductive layer on the substrate, completely covering a first and second sidewalls and the top surface of the rectangle-shaped dielectric pattern;

patterning the electric conductive layer to form a plurality of electric conductive patterns, wherein the electric conductive patterns partially covers the first sidewall and the top surface of the rectangle-shaped dielectric pattern and the substrate, exposing a part of the first sidewall and the whole second sidewall, wherein the electric conductive patterns covering the same rectangle-shaped dielectric pattern are apart from each other;

conformally forming a phase change layer on the substrate to cover the exposed first and second sidewalls and the top surface of the rectangle-shaped dielectric patterns;

anisotropically etching the phase change layer to form a phase change spacer on the substrate, wherein the phase change spacer directly contacts the exposed first sidewall of the rectangle-shaped dielectric patterns, and wherein the two adjacent electric conductive patterns covering the same rectangle-shaped dielectric pattern are electrically connected by the phase change spacer;

forming a dielectric layer on the substrate; and etching the dielectric layer to form a contact hole passing through the dielectric layer to expose the top surface of the electric conductive patterns.

11. The method as claimed in claim 10, wherein the rectangle-shaped dielectric pattern comprises a silicon-containing layer.

12. The method as claimed in claim 10, wherein the rectangle-shaped dielectric patterns are apart from each other by a specific distance.

13. The method as claimed in claim 10, wherein the electric conductive pattern comprises Pt, Au, Ag, Pd, Ru, RuO, Ir, IrO, TiN, TiAlN, TaN, or combinations thereof.

14. The method as claimed in claim 10, wherein the electric conductive patterns are rectangle-shaped, wherein the extended direction of the rectangle-shaped dielectric patterns is perpendicular to that of the rectangle-shaped electric conductive patterns.

15. The method as claimed in claim 10, wherein the phase change spacer comprises chalcogenide.

16. The method as claimed in claim 10, wherein the profile dimension of the phase change spacer is less than the resolution limit of photolithography process.

17. The method as claimed in claim 10, wherein the first sidewall of the rectangle-shaped dielectric pattern is alternately covered by the electric conductive patterns and the phase change spacer.

18. The method as claimed in claim 10, wherein the anisotropic etching process comprises a dry etching process.

19. The method as claimed in claim 10, wherein a part of surface of the substrate is exposed after forming the plurality of parallel rectangle-shaped dielectric patterns on the substrate.

* * * * *